(12) United States Patent
Montez et al.

(10) Patent No.: US 10,427,929 B1
(45) Date of Patent: Oct. 1, 2019

(54) FORMING A EUTECTIC BOND BETWEEN A WAFER HAVING AN ANTI-STICTION COATING AND A CAP WAFER

(71) Applicant: NXP USA, Inc., Austin, TX (US)

(72) Inventors: Ruben B. Montez, Cedar Park, TX (US); Colin Bryant Stevens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/053,882

(22) Filed: Aug. 3, 2018

(51) Int. Cl.
*B81C 1/00* (2006.01)
*B81B 3/00* (2006.01)
*B32B 15/20* (2006.01)
*B32B 15/04* (2006.01)

(52) U.S. Cl.
CPC .......... *B81B 3/0005* (2013.01); *B32B 15/043* (2013.01); *B32B 15/20* (2013.01); *B81C 1/00269* (2013.01); *B81C 2201/112* (2013.01); *B81C 2203/0145* (2013.01); *H01L 2224/83894* (2013.01)

(58) Field of Classification Search
CPC .................. H01L 2224/83894; B81B 3/00005
USPC .......................................................... 438/455
See application file for complete search history.

(56) References Cited

U.S. PATENT DOCUMENTS 7,443,001 B2 10/2008 Chen et al.
8,728,845 B2 5/2014 Lin et al.
8,905,293 B2 12/2014 Liu et al.
9,550,664 B2 1/2017 Montez et al.
9,988,260 B2 6/2018 Montez et al.
2012/0074417 A1* 3/2012 Nunan ................ B81C 1/00269 257/62
2012/0115305 A1* 5/2012 Peng .................. H01L 25/0657 438/455
2013/0288070 A1* 10/2013 Tsau ...................... H05K 13/04 428/612
2017/0210612 A1* 7/2017 Chen ....................... B81B 3/001
2018/0148327 A1* 5/2018 Chang ................ B81C 1/00269

* cited by examiner

*Primary Examiner* — David Vu
*Assistant Examiner* — Brandon C Fox
(74) *Attorney, Agent, or Firm* — Charlene R. Jacobsen

(57) ABSTRACT

A cap wafer bonded to a device wafer by a metal polysilicon germanium material to form a sealed chamber around a semiconductor device is provided. On the cap wafer, a stack of silicon (Si), polycrystalline silicon germanium (SiGe), and polycrystalline germanium (Ge) is formed. This stack of material layers is formed to intentionally have a roughened germanium surface. A metal structure is formed on a second wafer, having an anti-stiction coating layer on the surface of the metal structure. A metal silicon germanium bonding material is formed by placing the metal structure and germanium structure in contact and applying heat and pressure. The roughened germanium layer penetrates the anti-stiction coating layer upon application of the pressure. The germanium that penetrates to the metal is free of interfacial anti-stiction coating and allows for eutectic bond formation upon application of heat.

13 Claims, 12 Drawing Sheets

FORMING A EUTECTIC BOND BETWEEN A WAFER HAVING AN ANTI-STICTION COATING AND A CAP WAFER

FIELD OF THE INVENTION

This invention relates in general to semiconductor devices and more specifically for techniques for bonding enclosures of a microelectromechanical systems semiconductor device having an anti-stiction coating.

BACKGROUND OF THE INVENTION

With some types of semiconductor devices such as microelectromechanical system (MEMS) devices, it is desirable to seal the device (e.g. hermetically) for the device to perform properly over time. For example, with some types of MEMS accelerometers and gyroscopes, it is desirable to seal the MEMS device to prevent contamination of the moving parts of the MEMS device during subsequent processes and use.

One method for sealing a MEMS device is to bond a cap wafer to the wafer that includes the MEMS device. The cap wafer and the device wafer form a cavity for the MEMS device. Some cap wafers may include a lead glass frit located around the cavity that bonds to the second wafer under pressure and temperature. Other cap wafers may be attached using an aluminum germanium (AlGe) eutectic material bond. While AlGe material bonds have many advantages, there can be a poor bond between the cap wafer and the device wafer when an anti-stiction coating is formed on the surfaces of the MEMS device wafer.

What is therefore needed is an improved technique for forming an AlGe eutectic bond to seal a semiconductor device having an anti-stiction coating.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a cap wafer bonded to a device wafer by a metal polysilicon germanium material to form a sealed chamber around a semiconductor device. On the cap wafer, a stack of silicon (Si), polycrystalline silicon germanium (SiGe), and polycrystalline germanium (Ge) is formed. This stack of material layers is formed to intentionally have a roughened germanium surface. A metal structure is formed on a second wafer, having an anti-stiction coating layer on the surface of the metal structure. A metal silicon germanium bonding material is formed by placing the metal structure and germanium structure in contact and applying heat and pressure. The roughened germanium layer penetrates the anti-stiction coating layer upon application of the pressure. The germanium that penetrates to the metal is free of interfacial anti-stiction coating and allows for eutectic bond formation upon application of heat.

Figure 1:
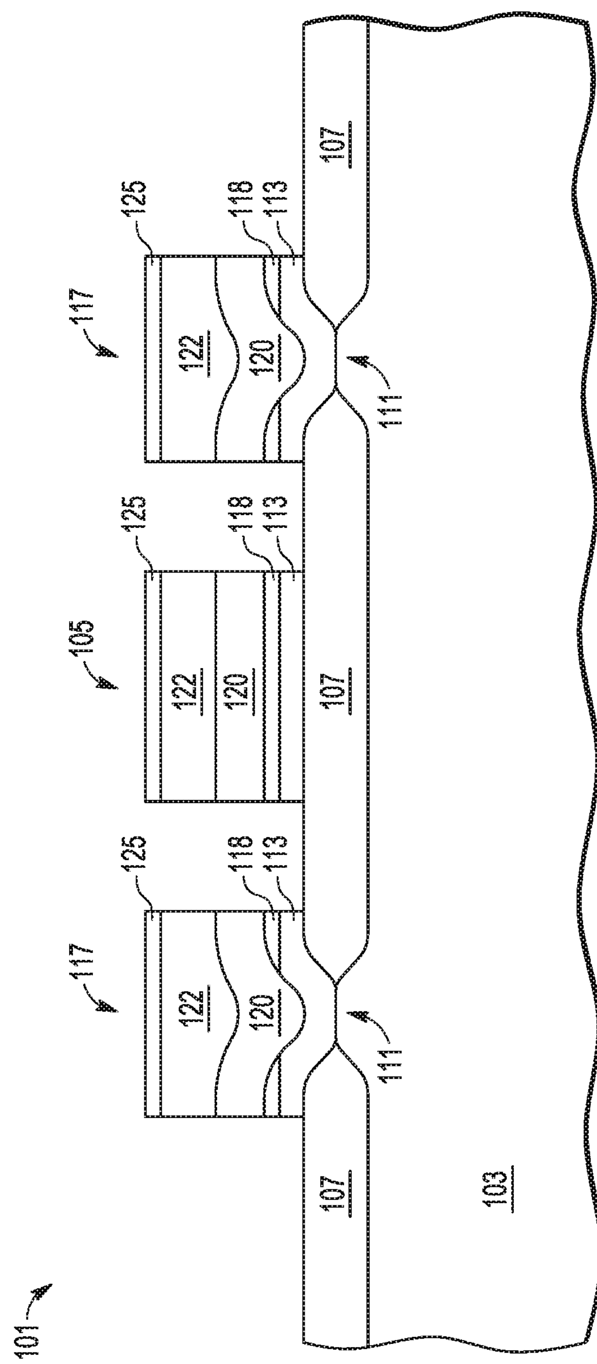
FIG. 1 is a simplified block diagram illustrating a cutaway side view of a device wafer having a MEMS device to be sealed with a cap wafer.

FIG. 1 is a simplified block diagram illustrating a cutaway side view of a device wafer 101 having a MEMS device 105 to be sealed with a cap wafer. In one example of a MEMS device, device 105 includes a proof mass (not shown) made of polysilicon that is supported by springs and is movable with respect to substrate 103. In such an embodiment, device 105 includes capacitive structures whose capacitance can be measured to detect the movement of the proof mass.

Wafer 101 includes a substrate 103 which in one embodiment is bulk monocrystalline silicon. An insulator layer 107 (e.g. $SiO_2$) is formed on substrate 103. In the embodiment shown, layer 107 is formed by a local oxidation of silicon (LOCOS) process, but may be formed by other methods in other embodiments. In one embodiment, the back side (not shown) of wafer 101 may be ground and polished. Layer 107 is formed with opening 111 located around the location of the subsequently formed semiconductor device 105.

After the formation of layer 107, polycrystalline silicon layers 113 and 120 and metal layer 122 are formed over layer 107. In one embodiment, layers 113, 120, and 122 are formed separately and then patterned prior to forming the next layer to form the desired structures of those layers. In some embodiments, a dielectric layer 118 may be formed subsequently or prior to the forming of polysilicon layers 113 and 120 for the isolation of various structures formed from those layers. Also, sacrificial layers (not shown) may be used for forming the desired structures that are later removed in subsequent processes. In one embodiment, dielectric layer 118 may be of a silicon rich nitride material. Other embodiments may have different combinations of material layers, but at least with a metal layer as the "top" layer of the stack for seal ring 117.

In the embodiment shown, MEMS device 105 includes layers 113, 118, 120, 122. In such a device, those layers maybe patterned to remove a portion of the layer at various locations in the device. However, for simplicity, device 105 is shown with those layers located in dashed lines all the way across device 105. In some embodiments, wafer 101 may include other semiconductor layers and metal layers.

Wafer 101 provides a seal ring 117 surrounding device 105. In the illustrated embodiment, ring 117 is located over opening 111. Thus, the polysilicon material of layer 113 is in contact with the silicon material of substrate 103.

Metal layer 122 is formed over a patterned layer 120. Metal layer 122 can be formed of aluminum, aluminum and copper, gold, platinum, tungsten, titanium, cobalt, nickel, tin, and tantalum, or combinations thereof. In some embodiments, layer 122 may include some non-metal materials such as germanium or silicon. In one embodiment, layer 122 includes 98% atomic weight or greater of a primary metal material (e.g. aluminum).

In some embodiments, the layers of seal ring 117 and MEMS device 105 can total 6-8 microns, but may be of other thicknesses depending upon the application.

In some embodiments, metal layer 122 is formed by physical vapor deposition, sputtering, evaporation, or plating. Layer 122 is subsequently patterned to form desired structures including on seal ring 117.

In some embodiments of MEMS device 105, it may be desirable to include an anti-stiction coating layer 125. In MEMS devices, static friction, or stiction, is attributed to device failure of sensors with moving actuators or masses. While any solid objects pressing against one another without sliding require some threshold of force to overcome static cohesion, the mechanisms for generating this force are different for MEMS devices. When two surfaces with areas below the micrometer range come into close proximity, the surfaces may adhere together due to electrostatic or Van der Waals forces. Stiction forces at this scale may also be related to hydrogen bonding or residual contamination on the surface.

For MEMS devices such as accelerometers, surfaces such as over-travel stops can come in close proximity or contact during use at the limits of the device design or during manufacture of the device. In these situations, stiction forces can cause the MEMS device parts to freeze in place and become unusable. Traditional methods of avoiding such close proximity travel or contact include increasing spring constants and increasing distances between parts of the MEMS device. But these methods can cause decreased sensitivity of the device, and therefore decreased utility.

By applying a molecular layer of low surface energy organics (e.g., anti-stiction coating layer 125), stiction can be mitigated or even eliminated. This allows for higher device reliability and sensitivity because smaller distances between parts and lower spring constants can be used. Examples of such low surface energy organics include FDTS (Heptadecafuoro-1,2,2,2-tetra-hydrodecyl) trichlorosilane and FOTS (Tridecafuoro-1,1,2,2-tetrahydrooctyl) trichlorosilane. These long alkyl-chains promote a self-assembling monolayer formation that creates a hydrophobic surface and lowers the coefficient of friction.

Figure 2:
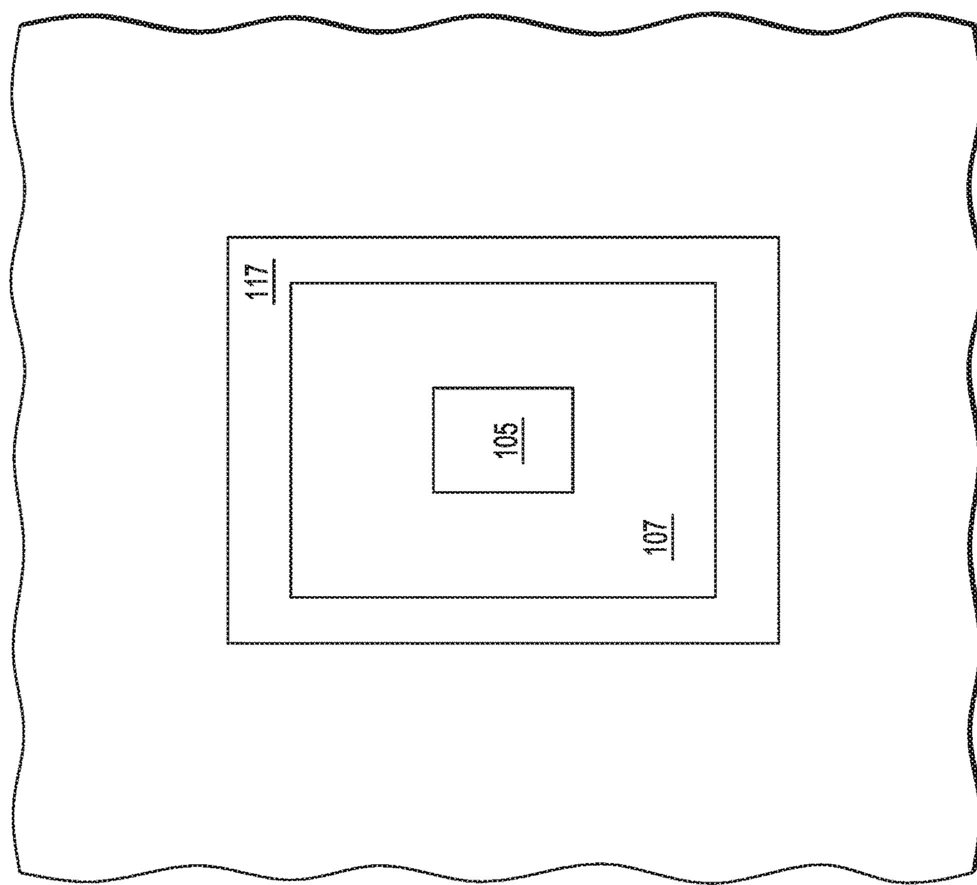
FIG. 2 is a simplified block diagram illustrating a top view of the wafer in FIG. 1.

FIG. 2 is a simplified block diagram illustrating a top view of wafer 101. Ring 117 is shown as having a rectangle shape located around device 105.

Figure 3:
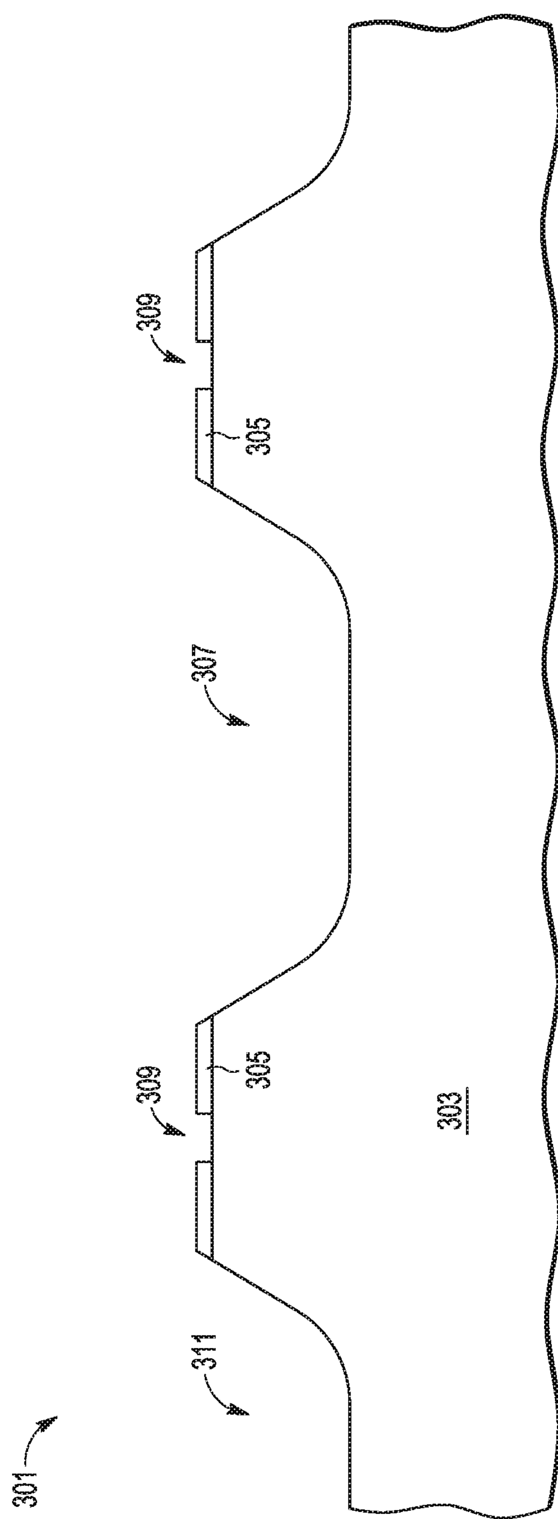
FIG. 3 is a simplified block diagram illustrating a partial side cutaway view of a prior art cap wafer.

FIG. 3 is a simplified block diagram illustrating a partial side cutaway view of a prior art cap wafer 301. In the embodiment shown, cap wafer 301 includes a bulk silicon substrate 303 and a layer of oxide 305 formed thereover. In one embodiment, layer 305 is thermally grown, but in other embodiments, it may be deposited. Layer 305 is 495 nm thick, but may be of other thicknesses in other embodiments.

After the formation of layer 305, openings are formed in layer 305 at the locations of trenches 311 and 307. Wafer 301 is then subjected to an etch process (either wet or dry) to form trenches 311 and 307 in substrate 303. Afterwards, opening 309 is formed in layer 305 to expose substrate 303.

Figure 4:
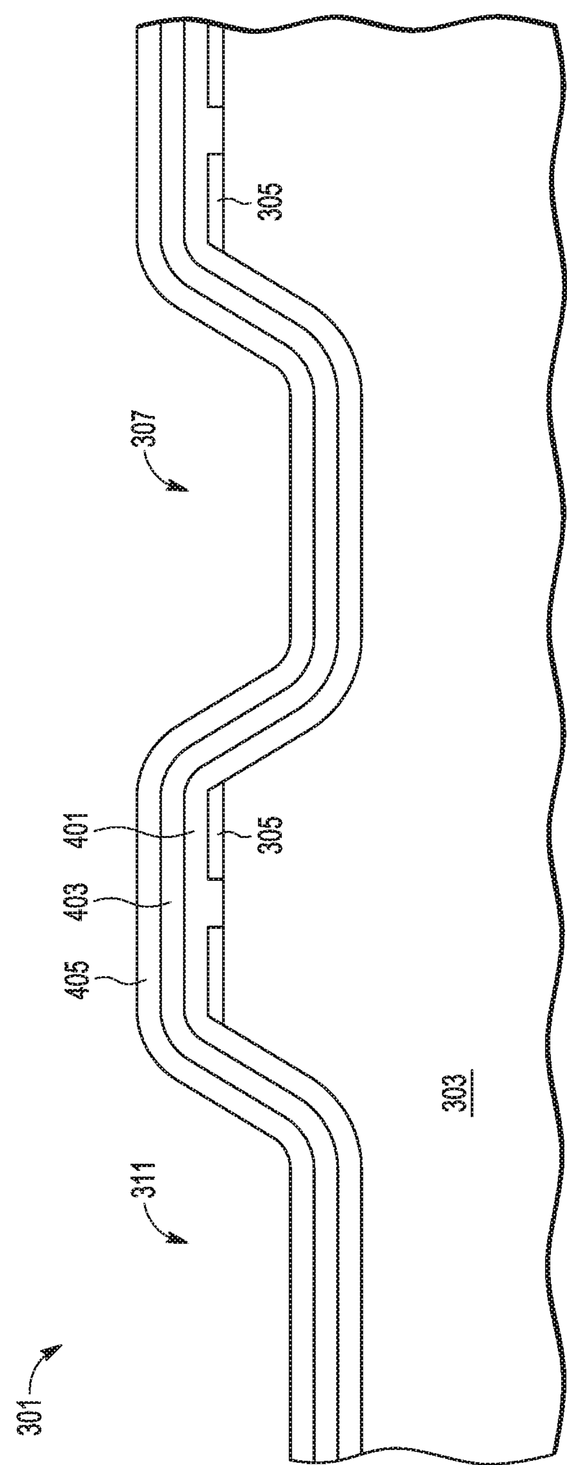
FIG. 4 is a simplified block diagram illustrating a partial side cutaway view of the prior art cap wafer at a further stage of processing.

FIG. 4 is a simplified block diagram illustrating a partial side cutaway view of prior art cap wafer 301 at a further stage of processing. A polysilicon layer 401 is formed over wafer 301. In one embodiment, layer 401 has a thickness in the range of 75-250 nm, but may have other thicknesses in other embodiments. In one embodiment, layer 401 is formed by a chemical vapor deposition process (CVD), but may be formed of other processes in other embodiments.

In some embodiments, layer 401 acts as a seed layer for subsequently formed layer 403. Layer 403 is made of silicon germanium. In one embodiment, layer 403 includes germanium in a range of 20-40 atomic percent with the remainder being of silicon. However, other embodiments may have a different atomic percentage of germanium. In one embodiment, the germanium concentration of layer 403 may vary with a lower concentration of germanium at the bottom of layer 403 and a higher concentration of germanium at the top of layer 403, relative to the view shown in FIG. 4. In one embodiment, layer 403 is formed by a CVD process, but may be formed by other processes in other embodiments.

Layer 405 is formed over layer 403. Layer 405 is made of poly crystalline germanium. In one embodiment, layer 405 has a thickness in the range of 200-400 nm, but may be of other thicknesses in other embodiments. In one embodiment, layer 405 is formed by a CVD process, but may be formed by other processes in other embodiments.

Figure 5:
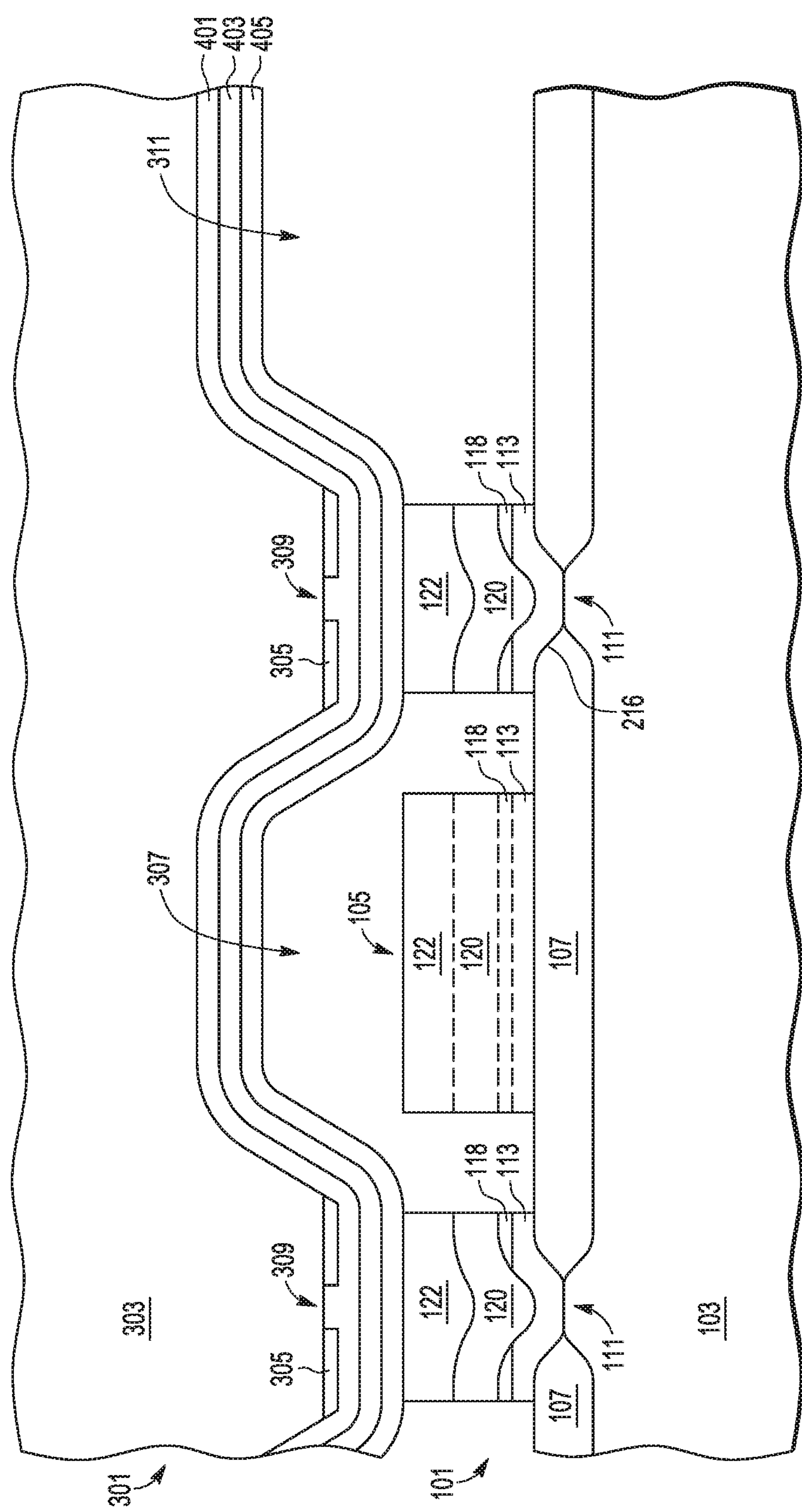
FIG. 5 is a simplified block diagram illustrating a partial cutaway side view showing the prior art cap wafer being brought into contact with the device wafer of FIG. 1.

FIG. 5 is a simplified block diagram illustrating a partial cutaway side view showing wafer 301 being brought into contact with wafer 101 where ring 117 is aligned to opening 309, trench 311 is located over contacts 121 and 123, and trench 307 is located over device 105. FIG. 5 shows both wafers just prior to the application of heat (and pressure in some embodiments) for bonding the two wafers together. In FIG. 5, there is no anti-stiction coating layer 125. This will be discussed in greater detail below.

Figure 6:
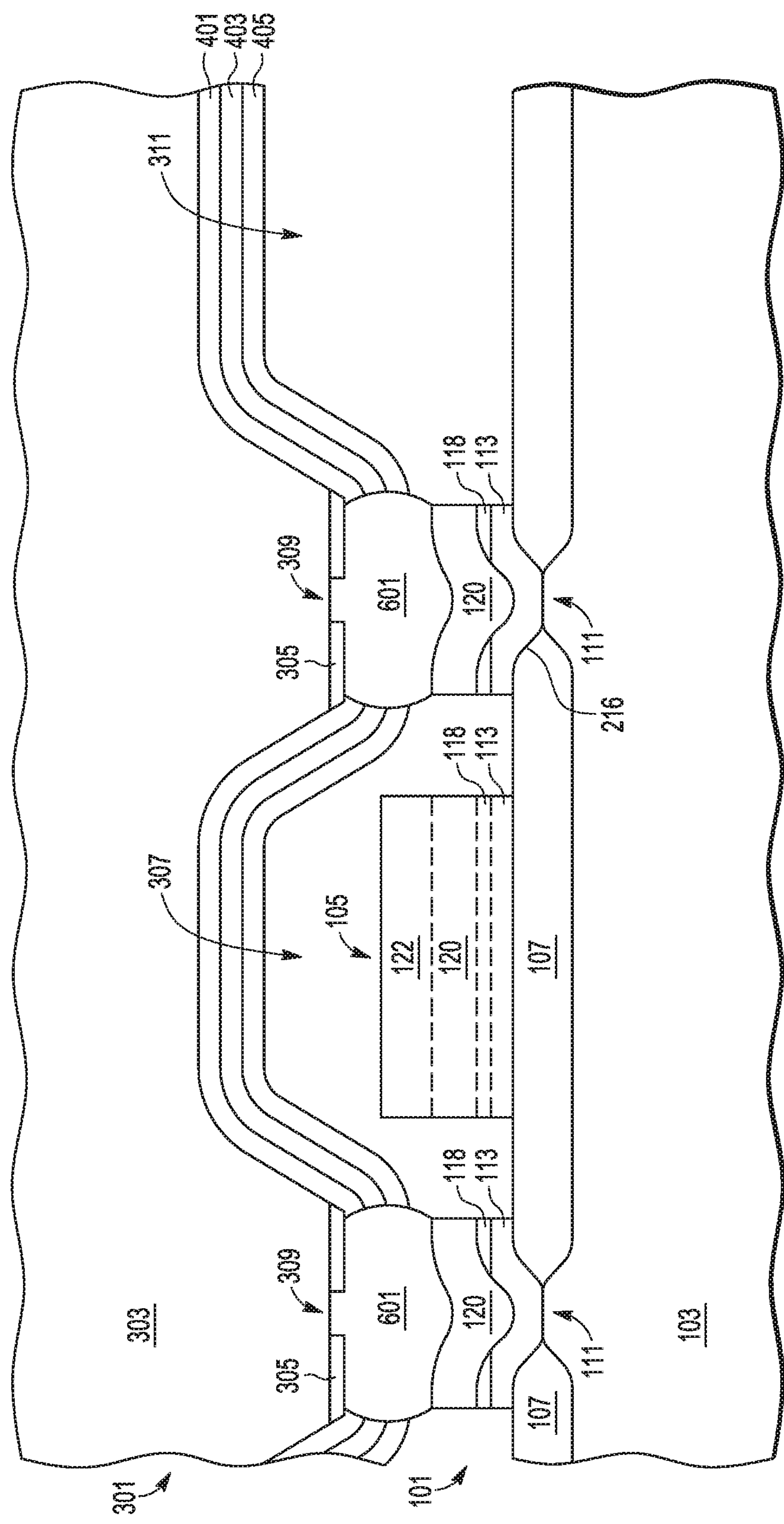
FIG. 6 is a partial cutaway side view after the wafers in FIG. 5 have been bonded together by applying heat to the wafers.

FIG. 6 is a partial cutaway side view after wafer 101 and 301 have been bonded together by applying heat to the wafers. During the bonding process, the metal material of layer 122 of ring 117 reacts with the polysilicon of layer 401, the polycrystalline silicon germanium of layer 403, and the polycrystalline germanium of layer 405 to form a bonding material 601 of aluminum, silicon, and germanium. In one embodiment, this material 601 is a ternary system of aluminum (or other metal in other embodiments), silicon, and germanium. In one embodiment, aluminum (or other material of layer 122 in other embodiments) is the largest component by volume, followed by germanium, and then silicon. Material 601 is conductive. In one embodiment, material 601 may be described as a Al—Ge—Si eutectic compound or an Al—Ge eutectic compound. In one embodiment, material 601 may be described as a compound film.

In embodiments where ring 117 completely surrounds device 105, material 601 provides for a hermetic seal for device 105 between wafers 101 and 301. In addition, material 601 can provide a conductive path (e.g. a ground path) between the two wafers.

The wafers can be bonded at a temperature in the range of 425-500 C, and more preferably at a temperature in the range 450-475 C. However other temperatures may be used in other embodiments. The use of aluminum for layer 122 is preferable in that it may allow for the use of bonding temperatures below 500 degrees Celsius. In some embodiments, during the bonding process, the gap between substrate 303 and substrate 103 is reduced from its position shown in FIG. 5.

In some embodiments, the wafers are bonded together under pressure in addition to the application of heat. In one embodiment, a tool force pressure of about $3\times10^4$ Pascals (30 kN) is applied. However, in other embodiments, other applied bonding force pressures may be used.

Figure 7:
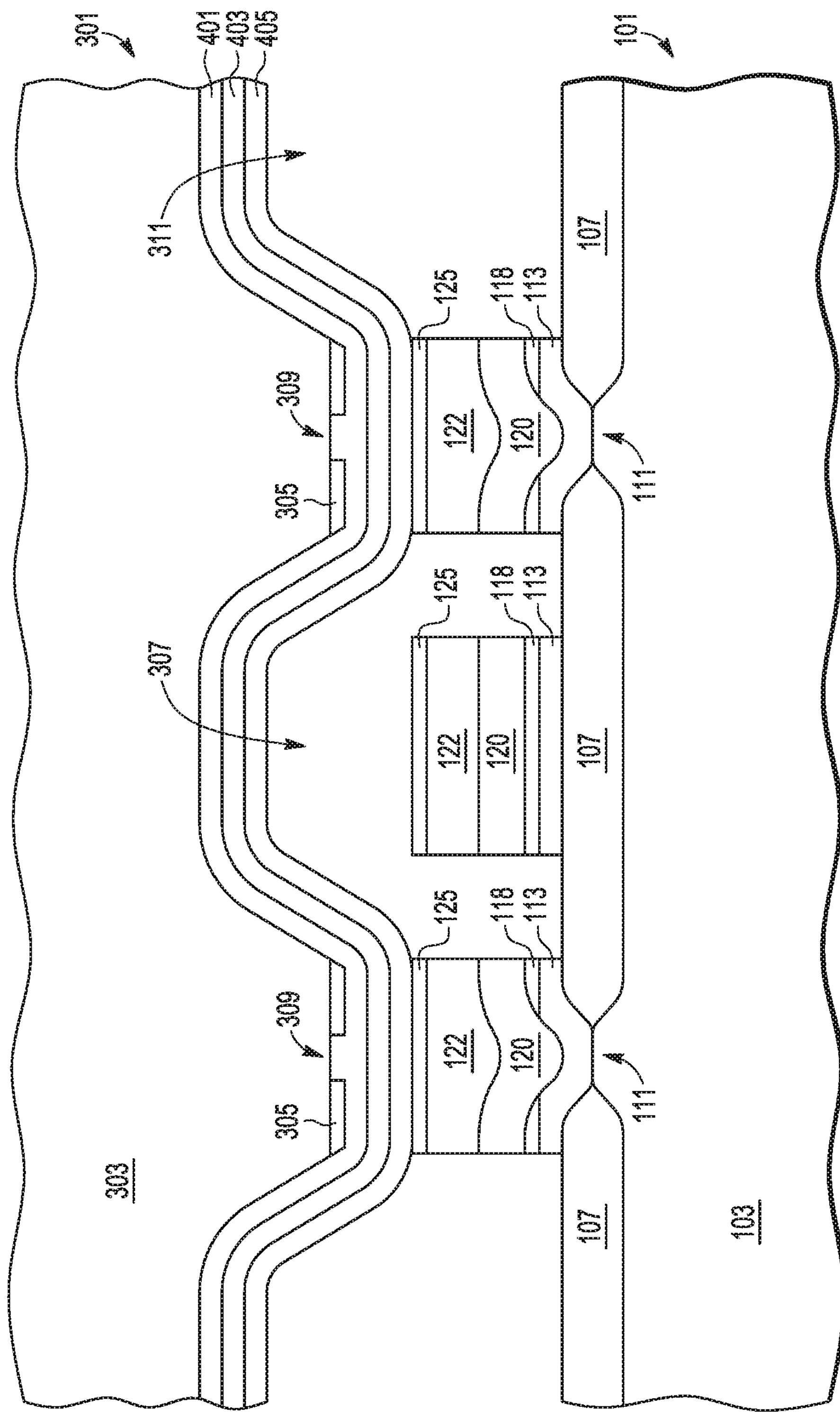
FIG. 7 is a simplified block diagram illustrating a partial cutaway side view showing the cap wafer being brought into contact with the device wafer where the device wafer incorporates an anti-stiction coating layer.

FIG. 7 is a simplified block diagram illustrating a partial cutaway side view showing cap wafer 301 being brought into contact with device wafer 101 where ring 117 is aligned to opening 309 and device wafer incorporates anti-stiction coating layer 125 on MEMS device 105 and ring 117. Due to the presence of the anti-stiction coating layer, polycrystalline Ge layer 405 is not in direct contact with metal layer 122.

Figure 8:
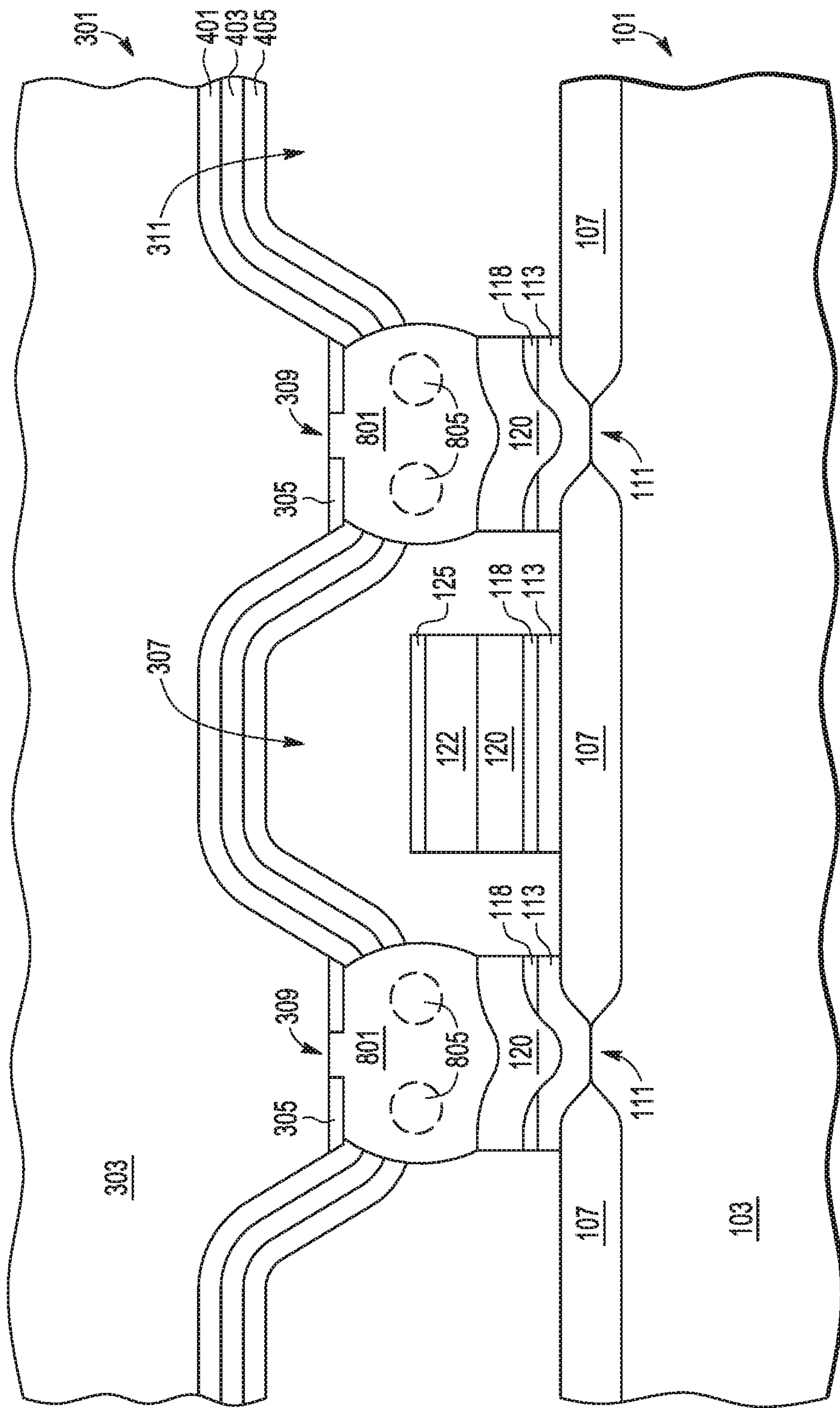
FIG. 8 is a simplified block diagram illustrating a partial cutaway side view after applying heat and pressure to the wafers of FIG. 7.

FIG. 8 is a simplified block diagram illustrating a partial cutaway side view after applying heat and pressure to wafers 101 and 301 of FIG. 7. As with FIG. 6, during the heat/pressure process, the metal of metal layer 122 of ring 117 reacts with polysilicon of layer 401, polycrystalline silicon germanium of layer 403, and polycrystalline germanium of layer 405, forming a material 801. But intervening anti-stiction coating layer 125 causes a lack of uniformity in AlGe within bonding material 801 resulting in voids 805. This lack of uniformity of the bonding material causes a structural weakness in the bond, which can result in separation of cap wafer 301 from device wafer 101 (i.e., cap wafer flyoff), and thus failure of the device.

In order to avoid the bonding failure between the cap wafer and the device wafer, embodiments of the present invention provide a mechanism by which the surface of the cap wafer polycrystalline germanium material is roughened. This roughening is performed to the extent necessary to allow the sealing ring surface (e.g., surface of layer 405) to penetrate the anti-stiction coating layer 125 of ring 117. This allows the polycrystalline germanium to come in direct contact with metal layer 122 of ring 117, free of the anti-stiction coating. The direct contact between the germanium and metal permits the formation of a eutectic bond as temperatures are raised.

Figure 9:
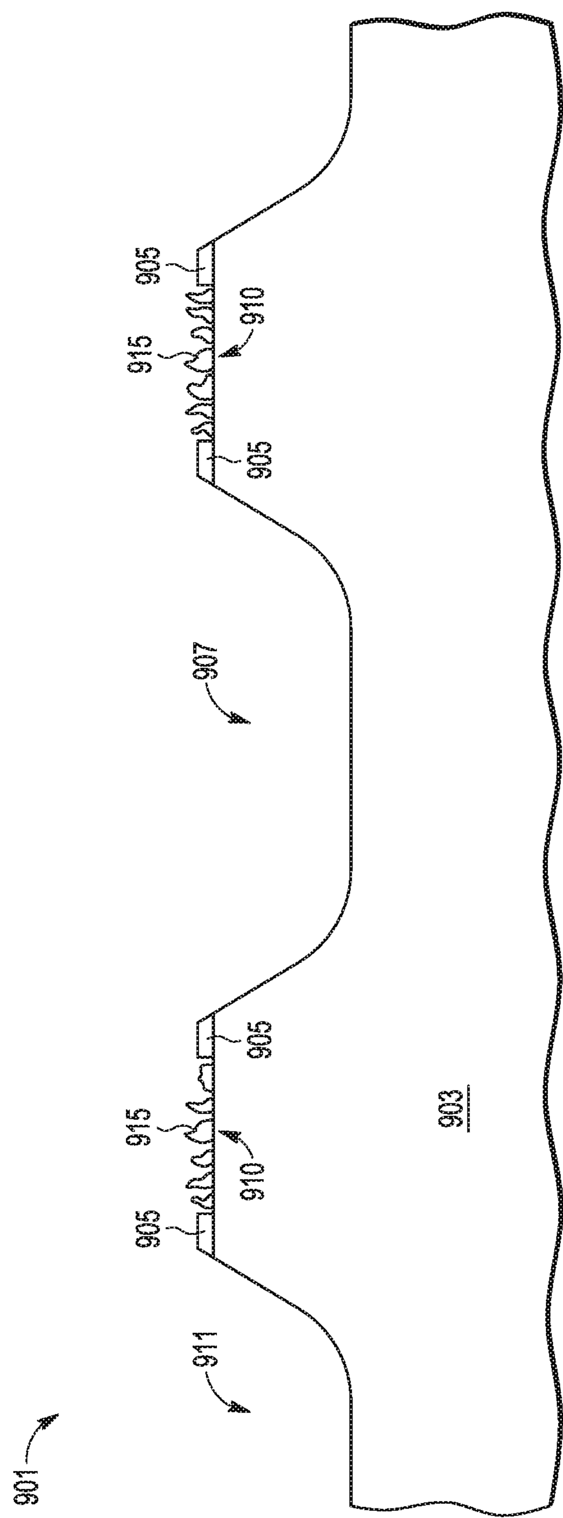
FIG. 9 is a simplified block diagram of a partial side cutaway view of a cap wafer at a first stage in formation of a roughened surface.

FIG. 9 is a simplified block diagram of a partial side cutaway view of a cap wafer 901 at a first stage in formation of a roughened surface, in accord with one embodiment of the present invention. In the illustrated embodiment, cap wafer 901 includes a bulk silicon substrate 903 and layer of oxide 905 formed thereover, as in the cap wafer illustrated in FIG. 3. Oxide layer 905 is formed for etching of the cap wafer, and can be removed subsequent to formation of trenches 907 and 911 in substrate 903 to expose substrate surface 910.

FIG. 9 illustrates a formation of rough polycrystalline silicon 915 on substrate surface 910. In one embodiment, the rough polycrystalline silicon is formed by deposition by reacting a silicon-containing gas (e.g., silane), gaseous HCl, hydrogen, and, optionally, a dopant gas for a first duration of time at a first temperature. In one embodiment, the dopant gas is phosphine such that the resulting layer is a polysilicon layer doped with phosphorus. Alternatively, other dopant gases can be used (e.g., arsine) or no dopant gas at all. The addition of HCl to the silicon-containing gas and the hydrogen decreases polysilicon growth rate and facilitates locally non-uniform surface polysilicon deposition on surface 910, thus increasing surface roughness of the resulting polysilicon layer.

The above-described deposition of non-uniform polysilicon can be performed at a temperature of at least 630 C for a first duration of time. The ratio between the silicon-containing gas and the hydrogen and HCL gases determines the thickness and resulting roughness of the polysilicon layer. After the initial deposition, then the temperature of the reaction chamber can be raised and an etch back performed using HCL and hydrogen at a temperature of at least 950 C for a second duration of time. The temperature of the etch back is greater than the temperature of the deposition and etch back is performed for a shorter time period. The etch back removes some of the polysilicon to increase the non-uniformity of that layer, thereby forming rough polycrystalline silicon 915. Portions of surface 910 may be exposed as the peaks and valleys of the non-uniform polycrystalline silicon are reduced in height.

Figure 10:
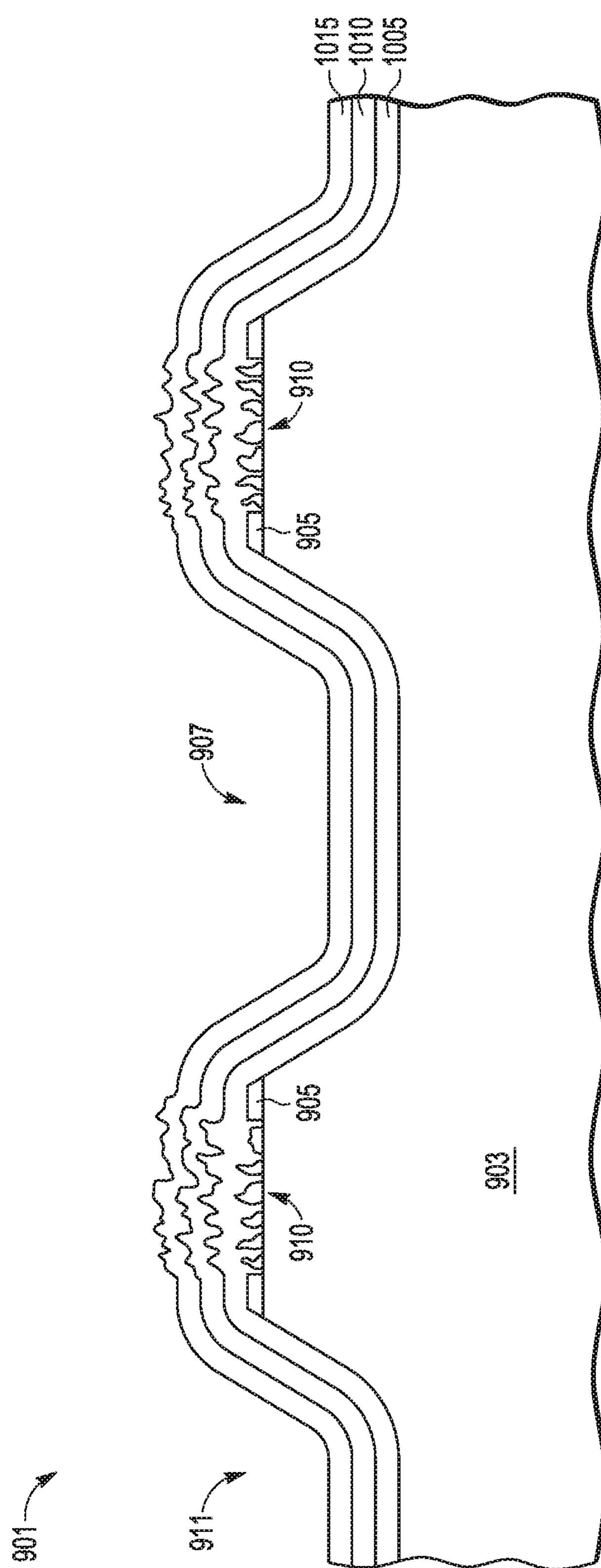
FIG. 10 is a simplified block diagram of a partial side cutaway view of the cap wafer of FIG. 9 at a subsequent stage in formation of a roughened polycrystalline germanium surface.

FIG. 10 is a simplified block diagram of a partial side cutaway view of cap wafer 901 at a subsequent stage in formation of a roughened polycrystalline germanium surface, in accord with one embodiment of the present invention. In one embodiment, layer 1005 includes polysilicon and has a thickness in the range of 75-250 nm, but may have other thicknesses in other embodiments. In one embodiment, layer 1005 is formed by a chemical vapor deposition process (CVD), but may be formed of other processes in other embodiments. In one embodiment, layer 1005 is formed by a process at a temperature greater than 550 degrees Celsius.

In some embodiments, layer 1005 acts as a seed layer for subsequently formed layer 1010. Layer 1010 is made of silicon germanium. In one embodiment, layer 1010 includes germanium in a range of 20-40 atomic percent with the remainder being of silicon. However, other embodiments may have a different atomic percentage of germanium. In one embodiment, the germanium concentration of layer 1010 may vary with a lower concentration of germanium at the bottom of layer 1010 and a higher concentration of germanium at the top of layer 1010, relative to the view shown in FIG. 4. In one embodiment, layer 1010 is formed by a CVD process, but may be formed by other processes in other embodiments. In one embodiment, silicon germanium layer 1010 has a thickness in the range of 50-200 nm, but may be of other thickness in other embodiments.

Layer 1015 is formed over layer 1010. Layer 1015 is made of polycrystalline germanium. In one embodiment, layer 1015 has a thickness in the range of 200-400 nm, but may be of other thicknesses in other embodiments. In one embodiment, layer 1015 is formed by a CVD process, but may be formed by other processes in other embodiments.

Due to underlying rough polycrystalline silicon layer 915, this roughness is imparted to the overlying layers 1005, 1010, and 1015. The difference between the highest peak and lowest valley is dependent upon the height of the rough polycrystalline silicon layer, and can be as much as 150 nm, but more typically between 40-60 nm.

Figure 11:
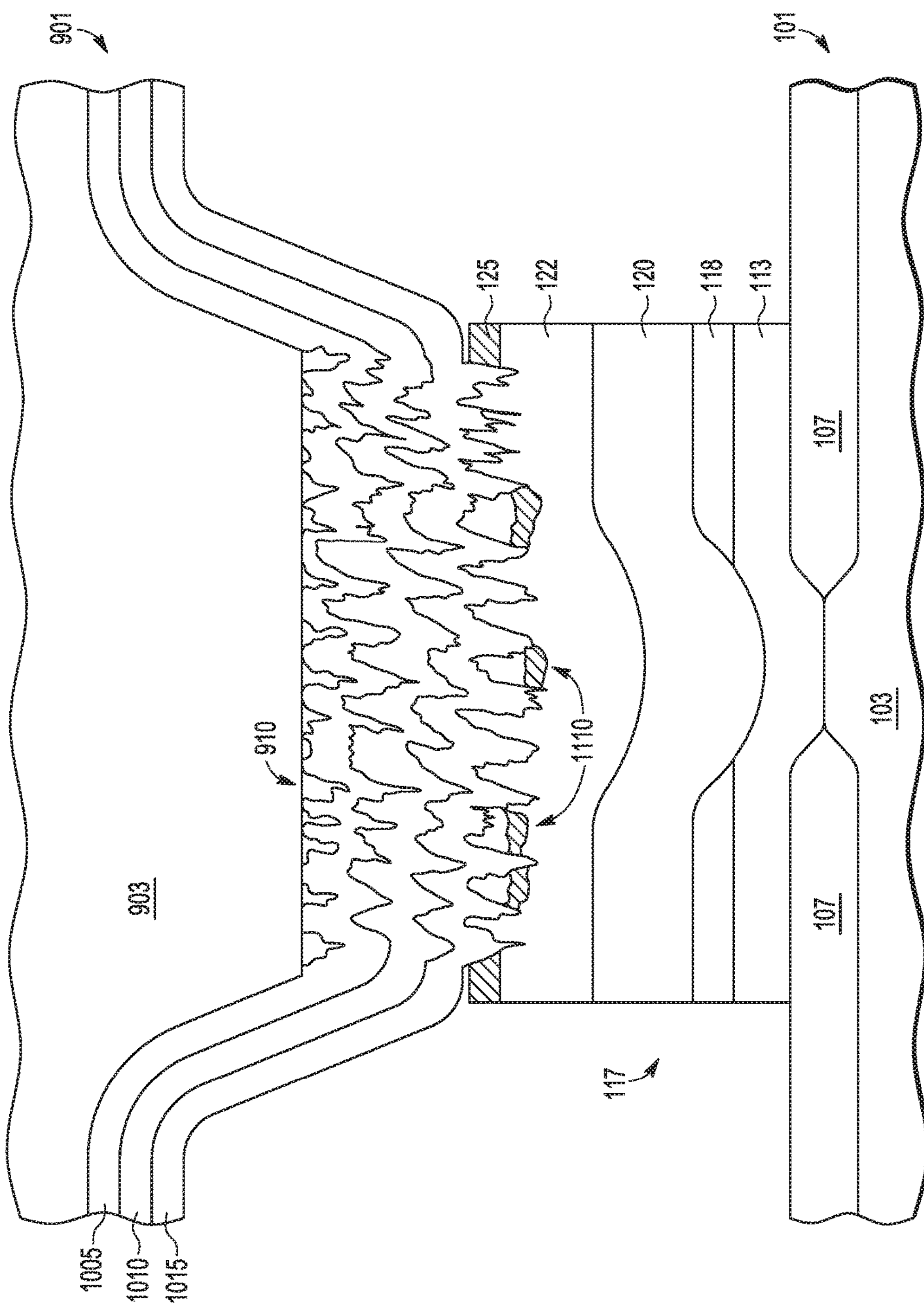
FIG. 11 is a simplified block diagram illustrating a partial cutaway side view showing the cap wafer of FIG. 10 being brought into contact with a device wafer.

FIG. 11 is a simplified block diagram illustrating a partial cutaway side view showing cap wafer 901 being brought into contact with device wafer 101 where ring 117 is aligned to a contact portion of the cap wafer. FIG. 11 is a close-up cutaway of the contact portion and the ring.

As discussed above, in FIG. 7, due to the presence of anti-stiction coating layer 125, the polycrystalline germanium layer 405 was not in direct contact with metal layer 122. By contrast, in FIG. 11, the roughened surface of polycrystalline germanium layer 1015, upon application of pressure, penetrates through the anti-stiction coating layer and comes into direct contact with metal layer 122. Portions 1110 of the anti-stiction coating layer may be dragged into the bulk of the metal layer as the polycrystalline germanium penetrates into the metal layer. In one embodiment, a pressure of $3\times10^4$ Pascals is applied to cause penetration by the germanium peaks, resulting in a desired germanium/metal contact.

Figure 12:
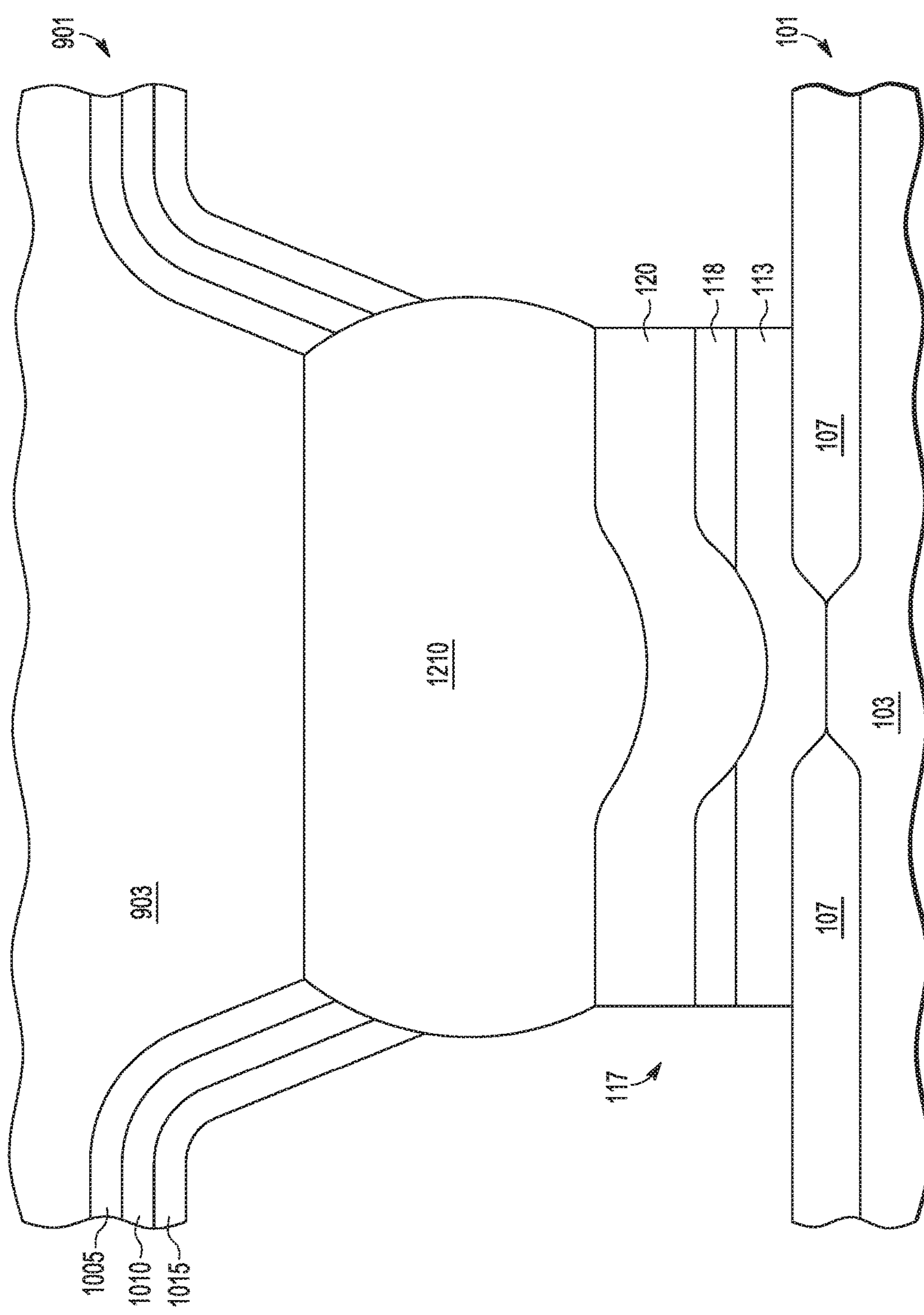
FIG. 12 is a simplified block diagram illustrating a partial cutaway side view after the wafers of FIG. 11 have been bonded together by applying heat and pressure to the wafers.

FIG. 12 is a simplified block diagram illustrating a partial cutaway side view after wafers 101 and 901 of FIG. 11 have been bonded together by applying heat and pressure to the wafers. The metal of metal layer 122 of ring 117 reacts with polysilicon of layer 1005, polycrystalline silicon germanium of layer 1010, and polycrystalline germanium of layer 1015, forming a bonding material 1210. The penetration of roughened polycrystalline germanium layer 1015 through the anti-stiction coating layer into metal layer 122 allows for a uniform distribution of AlGe within bonding material 1210. A bonding temperature in excess of 424 C is desired to achieve a eutectic bond. But it is desired to keep the bonding temperature below 470 C—a temperature at which the anti-stiction coating can begin to break down. In addition, if the bonding temperature is too high, there is a risk that the eutectic material may flow into the transducer causing the transducer to seize up. Testing has shown that bond temperatures in a range of 455 C to 470 C support a good AlGe eutectic bond formation that reduces cap flyoff failures and avoids these other issues.

By now it should be appreciated that there has been provided a method for forming a eutectic bond between a wafer having an anti-stiction coating and a cap wafer. In one embodiment, the method includes providing a first semiconductor substrate, forming a metal layer over the first semiconductor substrate, and forming an anti-stiction coating layer on the metal layer. The embodiment further includes providing a second semiconductor substrate, forming a roughened germanium layer over the second semiconductor substrate, and contacting the roughened germanium layer to the anti-stiction coating layer. After contacting the roughened germanium layer to the anti-stiction coating layer, the method further includes applying sufficient pressure to the second semiconductor substrate for at least a portion of the roughened germanium layer to penetrate the anti-stiction coating layer and come into contact with the metal layer, and forming a mechanical bonding material between the first substrate and the second substrate. The forming of the mechanical bonding material includes applying heat to the roughened germanium layer and the metal layer. The bonding material includes a metal of the metal layer and germanium of the germanium layer.

In one aspect of the above embodiment, the metal of the metal layer is aluminum. In a further aspect, the mechanical bonding material includes aluminum and germanium.

In another aspect of the above embodiment, the applying of sufficient pressure to the second semiconductor substrate for at least a portion of the roughened germanium layer to penetrate the anti-stiction coating layer includes applying a pressure of $3\times10^4$ Pascals or more. In another aspect of the above embodiment, the applying of heat includes applying heat at a temperature of 470 C or lower. In a further aspect, the applying of heat includes applying heat at a temperature of 455 C or higher.

In still another aspect of the above embodiment, the forming of the roughened germanium layer over the second semiconductor substrate includes forming polycrystalline silicon clusters over the second semiconductor substrate, depositing a first layer including silicon and germanium over the polycrystalline silicon clusters, and depositing a second layer including germanium over the first layer. In a further aspect, the first and second layers are characterized by being polycrystalline. In another further aspect, forming the polycrystalline clusters over the second semiconductor substrate includes depositing a polysilicon layer over the second semiconductor substrate, and etching the polysilicon layer using gaseous hydrochloric acid and hydrogen for a duration of time. The depositing of the polysilicon layer includes reacting a silicon-containing gas, gaseous hydrochloric acid, and hydrogen for another duration of time.

In another aspect of the above embodiment, applying sufficient pressure to the second semiconductor substrate for at least a portion of the roughened germanium layer to penetrate the anti-stiction coating layer includes applying a pressure of $3\times10^4$ Pascals or more. Another aspect includes forming a layer of polysilicon over the first substrate prior to forming the layer including metal where forming the layer including metal comprises forming the layer including metal on the layer of polysilicon.

Yet another aspect of the above embodiment includes forming a semiconductor device over the first substrate which is surrounded by a ring including the layer including metal, and forming a cavity in the second substrate where the contacting the roughened germanium layer to the anti-stiction coating further includes aligning the cavity with the semiconductor device. In a further aspect, the semiconductor device is a micro electromechanical system device.

In another aspect of the above embodiment, forming the anti-stiction coating layer on the metal layer includes forming a molecular layer of a low surface energy organic material on the metal layer. In a further aspect, the low surface energy organic material includes one of FDTS and FOTS.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:

providing a first semiconductor substrate;

forming a metal layer over the first semiconductor substrate;

forming an anti-stiction coating layer on the metal layer;

providing a second semiconductor substrate;

forming a roughened germanium layer over the second semiconductor substrate, wherein said forming the roughened germanium layer comprises:

forming polycrystalline silicon clusters over the second semiconductor substrate;

depositing a first layer comprising silicon and germanium over the polycrystalline silicon clusters; and depositing a second layer comprising germanium over the first layer;

contacting the roughened germanium layer to the anti-stiction coating layer; and after contacting the roughened germanium layer to the anti-stiction coating layer, applying sufficient pressure to the second semiconductor substrate for at least a portion of the roughened germanium layer to penetrate the anti-stiction coating layer and come into contact with the metal layer, and forming a mechanical bonding material between the first substrate and the second substrate, wherein the forming a mechanical bonding material includes applying heat to the roughened germanium layer and the metal layer, and the bonding material comprises a metal of the metal layer and germanium of the germanium layer.

2. The method of claim 1, wherein the metal of the metal layer is aluminum.

3. The method of claim 2, wherein the mechanical bonding material comprises aluminum and germanium.

4. The method of claim 1 wherein said applying sufficient pressure to the second semiconductor substrate for at least a portion of the roughened germanium layer to penetrate the anti-stiction coating layer comprises applying a pressure of $3\times10^4$ Pascals or more.

5. The method of claim 1 wherein said applying heat comprises applying heat at a temperature of 470 C or lower.

6. The method of claim 5 wherein said applying heat comprises applying heat at a temperature above 455 C.

7. The method of claim 1 wherein the first and second layers are characterized by being polycrystalline.

8. The method of claim 1 wherein said forming polycrystalline silicon clusters over the second semiconductor substrate comprises:

depositing a polysilicon layer over the second semiconductor substrate, wherein said depositing comprises reacting a silicon-containing gas, gaseous hydrochloric acid, and hydrogen for a first duration of time; and etching the polysilicon layer using gaseous hydrochloric acid and hydrogen for a second duration of time.

9. The method of claim 1, further comprising forming a layer of polysilicon over the first substrate prior to forming the layer including metal, wherein said forming the layer including metal comprises forming the layer including metal on the layer of polysilicon.

10. The method of claim 1 further comprising:

forming a semiconductor device over the first substrate which is surrounded by a ring comprising the layer including metal; and forming a cavity in the second substrate, wherein said contacting the roughened germanium layer to the anti-stiction coating further comprises aligning the cavity with the semiconductor device.

11. The method of claim 10 wherein the semiconductor device is a micro electromechanical system (MEMS) device.

12. The method of claim 1 wherein said forming the anti-stiction coating layer on the metal layer comprises forming a molecular layer of a low surface energy organic material on the metal layer.

13. The method of claim 12 wherein the low surface energy organic material comprises one of (Heptadecafuoro-1,2,2,2-tetra-hydrodecyl) trichlorosilane (FDTS) and (Tridecafuoro-1,1,2,2-tetrahydrooctyl) trichlorosilane (FOTS).

* * * * *